(12) United States Patent
Cahill et al.

(10) Patent No.: US 9,711,479 B2
(45) Date of Patent: Jul. 18, 2017

(54) SUBSTRATE LESS DIE PACKAGE HAVING WIRES WITH DIELECTRIC AND METAL COATINGS AND THE METHOD OF MANUFACTURING THE SAME

(71) Applicant: ROSENBERGER HOCHFREQUENZTECHNIK GMBH & CO. KG, Fridolfing (DE)

(72) Inventors: Sean S. Cahill, Santa Clara, CA (US); Eric A. Sanjuan, Santa Clara, CA (US)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 0 days.

(21) Appl. No.: 14/902,360

(22) PCT Filed: Jul. 2, 2014

(86) PCT No.: PCT/EP2014/001822
§ 371 (c)(1),
(2) Date: Dec. 31, 2015

(87) PCT Pub. No.: WO2015/000593
PCT Pub. Date: Jan. 8, 2015

(65) Prior Publication Data
US 2016/0372440 A1    Dec. 22, 2016

Related U.S. Application Data

(60) Provisional application No. 61/842,950, filed on Jul. 3, 2013.

(51) Int. Cl.
*H01L 23/495* (2006.01)
*H01L 23/00* (2006.01)
(Continued)

(52) U.S. Cl.
CPC ............ *H01L 24/48* (2013.01); *H01L 21/568* (2013.01); *H01L 23/4952* (2013.01);
(Continued)

(58) Field of Classification Search
CPC ............................... H01L 24/48; H01L 21/568
(Continued)

(56) References Cited

U.S. PATENT DOCUMENTS 4,746,767 A * 5/1988 Gruhn ................ H01B 11/1016
174/105 R
5,818,105 A * 10/1998 Kouda ................ H01L 23/3107
257/695
(Continued)

FOREIGN PATENT DOCUMENTS

JP         2010206162 A      9/2010

*Primary Examiner* — Jami M Valentine
(74) *Attorney, Agent, or Firm* — DeLio, Peterson & Curcio, LLC; Robert Curcio

(57) ABSTRACT

A die package having a plurality of connection pads, a plurality of wire leads having metal cores with a defined core diameter, and a dielectric layer surrounding the metal cores having a defined dielectric thickness, at least one first connection pad held in a mold compound covering the die and the plurality of leads connected to at least one metal core, and at least one second connection pad held in the mold compound covering the die and the plurality of leads connected to at least one metal core. Further, the present invention relates to a method for manufacturing a substrate less die package.

9 Claims, 4 Drawing Sheets

(51) Int. Cl.
*H01L 21/56* (2006.01)
*H01L 23/64* (2006.01)

(52) U.S. Cl.
CPC .............. *H01L 23/64* (2013.01); *H01L 24/49* (2013.01); *H01L 2223/6611* (2013.01); *H01L 2224/4569* (2013.01); *H01L 2224/45565* (2013.01); *H01L 2224/45572* (2013.01); *H01L 2224/48091* (2013.01); *H01L 2224/48227* (2013.01); *H01L 2224/4903* (2013.01); *H01L 2224/85001* (2013.01); *H01L 2224/8592* (2013.01); *H01L 2224/85931* (2013.01); *H01L 2224/85935* (2013.01); *H01L 2224/85939* (2013.01); *H01L 2924/00014* (2013.01); *H01L 2924/15311* (2013.01); *H01L 2924/181* (2013.01); *H01L 2924/18165* (2013.01)

(58) Field of Classification Search
USPC ........................................................ 257/668
See application file for complete search history.

(56) References Cited

U.S. PATENT DOCUMENTS

| | | |
|---|---|---|
| 6,770,822 B2 | 8/2004 | Pasternak et al. |
| 8,839,508 B2 | 9/2014 | Sanjuan et al. |
| 2002/0070446 A1* | 6/2002 | Horiuchi ............... H01L 21/568 |
| | | 257/723 |
| 2009/0159320 A1 | 6/2009 | Sanjuan |
| 2010/0025864 A1 | 2/2010 | Bailey |
| 2013/0240241 A1* | 9/2013 | Dubrow ................. H01B 3/004 |
| | | 174/113 R |
| 2016/0190047 A1* | 6/2016 | Cahill ............... H01L 23/49838 |
| | | 257/676 |

* cited by examiner

SUBSTRATE LESS DIE PACKAGE HAVING WIRES WITH DIELECTRIC AND METAL COATINGS AND THE METHOD OF MANUFACTURING THE SAME

BACKGROUND OF THE INVENTION

1. Field of the Invention

The present invention relates to die packages with at least one die having a plurality of connection pads and a plurality of leads extending from the connection pads, the leads having metal cores with a defined core diameter and a dielectric layer surrounding the metal cores having a defined dielectric thickness, respectively.

2. Description of Related Art

Electronic devices and components are operating at ever increasing speeds and over increasing frequency ranges. Popular semiconductor package types use wire bonds that can connect to a substrate or leadframe, which in turn can connect to second level interconnects, vias, substrate or package traces, solder balls, or the like, for connection to a printed circuit board (PCB) of an electronic device.

However, packaging can be expensive, particularly if the substrate requires costly materials or precision drilling, etch, or formation of vias.

SUMMARY OF THE INVENTION

Bearing in mind the problems and deficiencies of the prior art, it is an object of the present invention to provide a die package that can be manufactured easily and with reduced overall production costs. The above and other objects, which will be apparent to those skilled in the art, are achieved in the present invention which is directed to a die package comprising a die having a plurality of connection pads, a plurality of leads having metal cores with a defined core diameter, and a dielectric layer surrounding the metal cores having a defined dielectric thickness, at least one first connection pad held in a mold compound covering the die and the plurality of leads, the first connection pad being connected to the metal core of a first lead, and at least one second connection pad held in the mold compound covering the die and the plurality of leads, the second connection pad being connected to the metal core of a second lead. The die package is preferably a "coreless" package without a permanent substrate for die attachment. The die package according to the invention can be connected to a printed circuit board or to a substrate by means of solder balls, for example.

The first and/or the second connection pads can be held in the mold component in such a way that they are exposed so that they can be connected to the PCB or to the substrate. In other words, the connection pads are held by the overmold compound without being supported by a die substrate.

The first connection pad may be connected to the metal core of a first lead and the second connection pad may be connected to the metal core of a second lead, whereas the first lead is longer than the second lead, has a different core diameter and/or has a different dielectric diameter.

The die package can include several dies which may be arranged as stacked dies. Further, at least one of the leads may be a ribbon lead formed by total or partial fusion of the dielectric coatings of two or more leads. The dependent claims are directed to advantageous embodiments of the invention.

Further, the present invention is directed to a method of manufacturing a die package according to the invention, the method comprising the following steps: placing of one or more dies on a temporary workpiece including temporarily attached pads, using wirebonding to connect the die to the temporarily attached pads, coating of metal cores of the wirebonds with a dielectric coating, overmolding the die assembly and the leads, and removing at least part of the temporary workpiece and/or at least part of the overmold to expose the attached pads for connecting them to a printed circuit board or another substrate, for example by means of solder balls.

The method may further include one or more of the additional method steps shown in FIG. 2.

According to the invention, "coreless" semiconductor die packages can be produced. During manufacture, these die packages have leads attached between the die and pads on a temporary substrate. After the overmold, the temporary substrate is removed to allow exposure of the lead attached pads. The leads include a metal core surrounded by a dielectric. Preferably, they further include a metallized outer layer attached to ground pad connections.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-4 of the drawings in which like numerals refer to like features of the invention.

Figure 1:
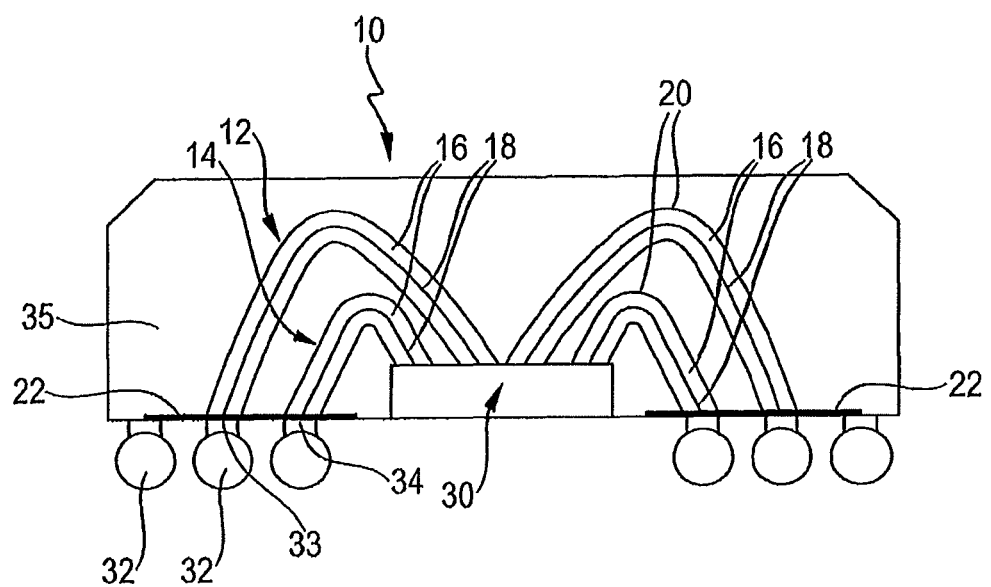
FIG. 1 is an illustration of dielectric and metal coated leads in a coreless package.

As seen in FIG. 1, a "coreless" package 10 without a permanent substrate for die attachment can be constructed. Such a semiconductor die packaging system can be formed to have leads 12, 14 with a dielectric layer 16 deposited over an inner metal core 18, as well as an outer metal layer 20 deposited over the dielectric layer 16. In operation, the outer metal layer 20 is attached to a ground pad 22. The leads 12, 14 are attached to die 30 that can include multiple connection pads for signal, power, or other functionality required by the die 30.

In the described embodiment, the die 30 does not have to be attached to a permanent substrate. Leads 12, 14 can connect to conductive pads 34, while the conductive pads can be attached by means of solder balls 32, gold bumps, or other suitable interconnects to a printed circuit board or other substrate. As illustrated, the leads 12, 14 are surrounded by an epoxy or other mold packaging compound, and may have substantially different lengths. In the illustrated embodiment, all leads have substantially the same impedance due to lead construction, even though lengths may differ. However, in other embodiments the leads can be constructed to have distinctly different impedances. For example leads that have a metal core of a defined diameter along its length can be sequentially coated with a thin dielectric layer and a conductive metal layer. Such leads are suitable for transfer of power because the consequent low impedance reduces power sag. Alternatively, leads that have a much thicker dielectric layer are more suitable for transmission of signal data. In certain embodiments, due to the superior electrical characteristics of lead construction as disclosed, leads having substantially different lengths but the same core diameter can have substantially the same impedance, within 10% of target impedance, despite having lengths that vary 50% or greater. In certain embodiments, lead differences can be even greater, with two leads having the same cross sectional structure and impedance, but one lead being as much as ten (10) times the length of the other. In still other embodiments, stacked die are contemplated, as are ribbon connections formed by total or partial fusion of dielectric coatings forming the leads.

Figure 2:
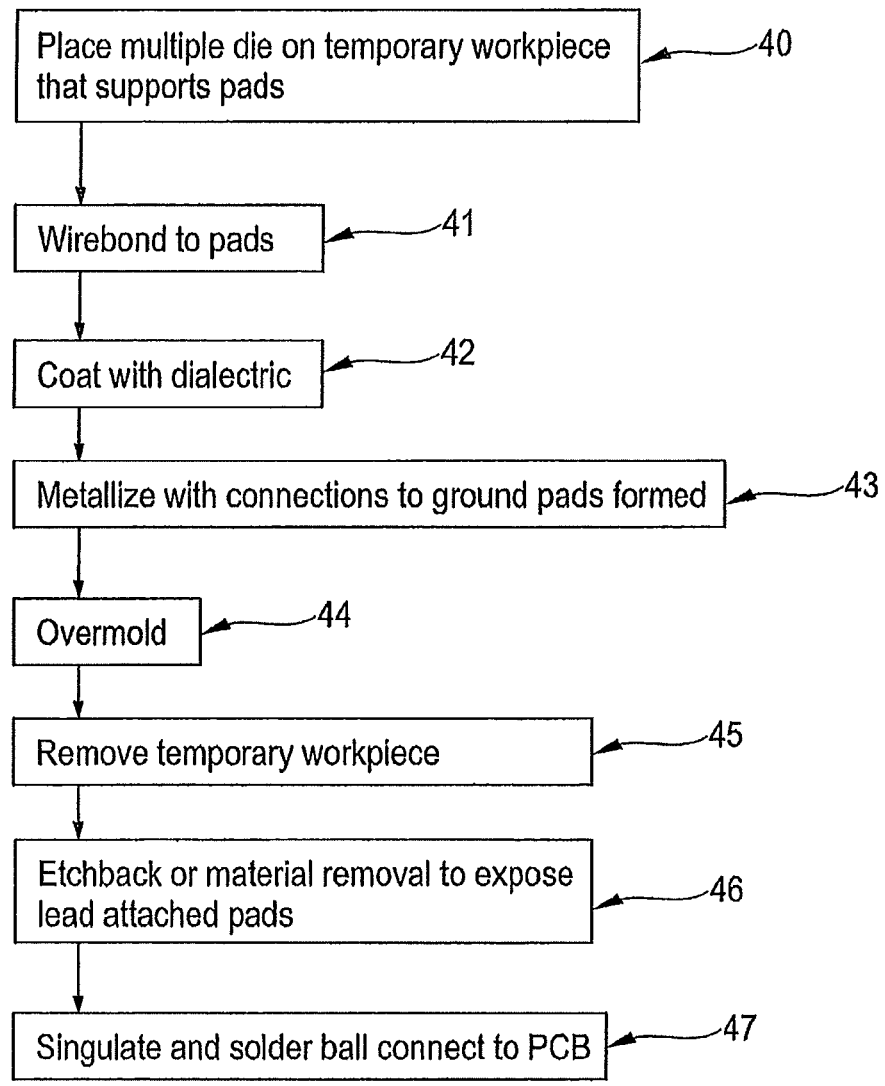
FIG. 2 illustrates one embodiment of a method for manufacture of a coreless package.

FIG. 2 is one embodiment of a method for manufacture of a coreless package such as described with respect to FIG. 1. Multiple dies can be temporarily attached (40) to a workpiece that can be later physically released and removed, or otherwise etched or chemically eliminated. The workpiece includes temporarily attached pad to support both metal core and outer metal ground layer attachment of each lead. Wirebonding (41) is used to connect the die to the temporarily attached pads surrounding the die, followed by a dielectric coating (42) of the metal core. The dielectric layer is metallized (43), with connections to ground pads being formed, and the entire multiple die assembly and leads are overmolded (44). After curing of the overmold, the temporary workpiece is removed (45), and the overmold may be etched or otherwise removed (46) by grinding or polishing to better expose the lead attached pads. Individual die and their connected leads can be singulated, and readied for solder ball or other connection to a printed circuit board (PCB) or another substrate (47).

Generally, thin dielectric layers will provide low impedance, suitable for power lines, thick dielectric is good for signal, and outer metal layers are connected to same ground. Note that a combination of core diameters and dielectric thicknesses is possible and a series of such steps may be performed to achieve more than two impedances. In certain embodiments it may be desirable to have large cores on power lines to increase power handling capacity, reduce power line temperatures, and/or further compensate any inductance on power supply and ground lines that would exacerbate ground bounce or power sag. Dielectric layers of intermediate thickness are also useful, since many packages could benefit from having leads of three (3) or more different dielectric thicknesses. For example, a lead that has an intermediate dielectric thickness could be used to connect a source and load of substantially different impedance to maximize power transfer. For example, a 10 ohm source can be coupled to a 40 ohm load with a 20 ohm lead. Also, since cost of dielectric can be high, critical signal pathways can be interconnected using thick dielectric, with less critical status, reset, or the like leads can be coated with a dielectric layer having a thickness greater than the power leads, but less than (intermediate) to the critical signal leads. Advantageously, this can reduces dielectric deposition material cost and time. The precise thickness of the dielectric coating may be chosen, in combination with the wirebond diameter, to achieve a particular desired impedance value for each lead.

$$Z_0 = \sqrt{\frac{L}{C}} = \frac{138}{\sqrt{\varepsilon_r}} \cdot \log\left(\frac{b}{a}\right) \quad (1)$$

The characteristic impedance of a coax line is given in Eq. (1), where L is the inductance per unit length, C is the capacitance per unit length, a is the diameter of the bond wire, b is the outside diameter of the dielectric and $\varepsilon_r$ is relative permittivity of the coaxial dielectric.

Figure 3:
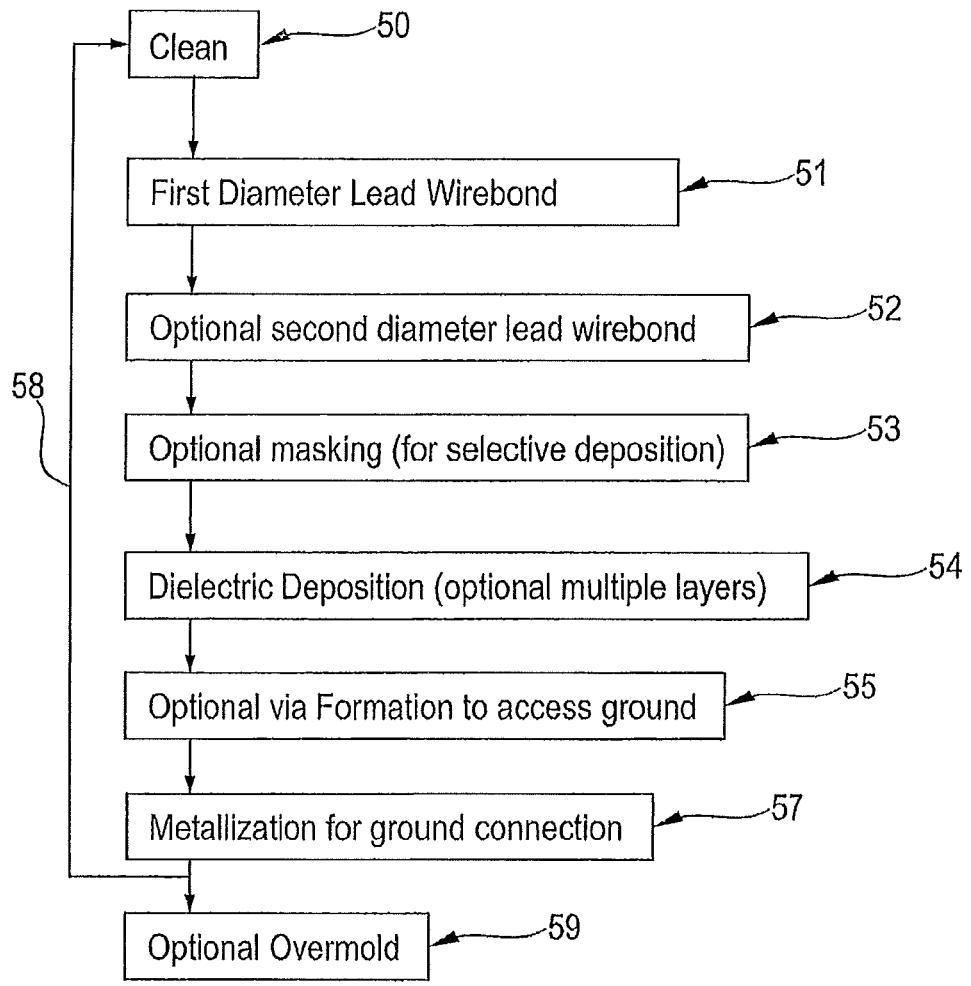
FIG. 3 illustrates method steps for manufacture of dielectric coated leads with outer ground connected metallization useful in the embodiment illustrated with respect to FIGS. 1 and 2.
Figure 4:
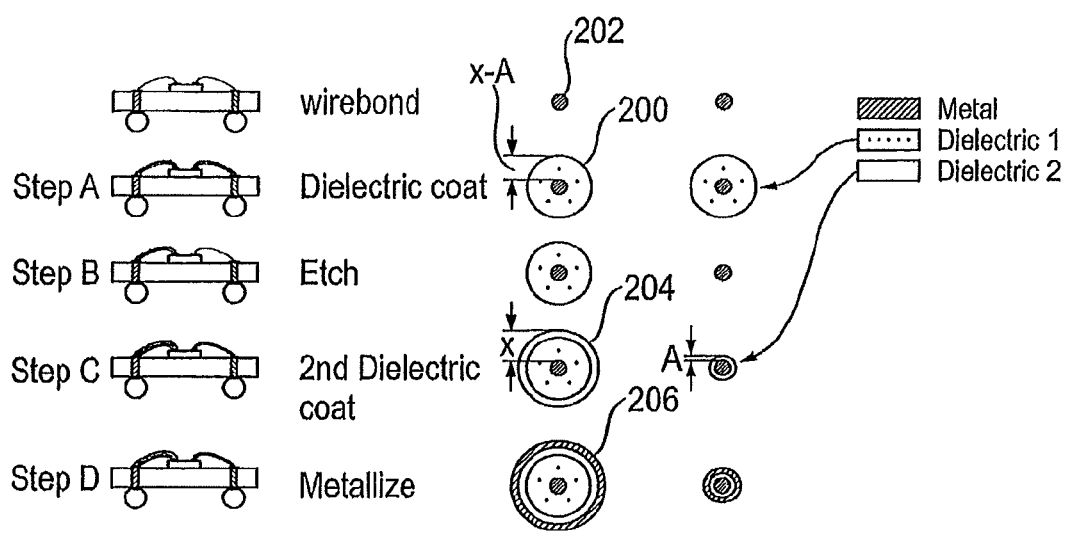
FIG. 4 illustrates a subtractive method for manufacture of dielectric coated leads with outer ground connected metallization.

As illustrated in FIG. 3, in one embodiment manufacture of dielectric coated leads with outer ground connected metallization can proceed using the following steps. Connection pads are cleaned (50) on the die and the substrate and a wirebonder is used to connect the die to the connection pads (51). Optionally, a second diameter wire can be attached (52) (e.g., a larger diameter wire suitable for power connections), or areas of the die can be masked (53) or otherwise protected to allow for selective deposition. One or more layers of dielectric of the same or different composition can be deposited (54), followed by selective laser or thermal ablation, or chemical removal of portions of the dielectric to allow access to ground connections covered in the dielectric deposition step (55). This step is optional, since in some embodiments, the need for a ground via can be eliminated. This is particularly true for die operating at higher frequencies, since frequency dependence on thickness value (function of $\varepsilon_r$) allows for ground establishment through capacitive coupling. Metallization (57) follows, covering the dielectric with a metal layer that forms the outermost metallized layer of the leads, and also connecting the leads to ground. The entire process can be repeated multiple times (58), useful for those embodiments using selective deposition techniques, and particularly for those embodiments supporting multiple die or complex and varied impedance leads. In the final step, for non-cavity packages, an overmold can be used to encapsulate leads (59).

In certain embodiments, modifications and additions to the described process are possible. For example, providing conformal coatings of dielectric can be accomplished through a variety of methods using chemical (electrophoretic), mechanical (surface tension), catalytic primer, electromagnetic [UV, IR], electron beam, or other suitable techniques. Electrophoretic polymers are particularly advantageous because they can rely on self-limiting reactions that can deposit precise thicknesses readily by adjusting process parameters and or simple additive, concentration, chemical, thermal, or timing changes to an electrophoretic coating solution.

In other embodiments, dielectric precoated bondwires can be used to form leads. While commercially available coated wires typically are thinner in dielectric thickness than is necessary to create, for example, 50 ohm leads, the foregoing discussed dielectric deposition steps can be used to increase dielectric thickness to set the desired impedance. Use of these precoated wires can simplify other process steps necessary to create coaxes, and can allow for thinner layers of needed vapor deposited dielectrics and faster processing times to create ground vias. Precoated bondwires can be used to prevent shorting for narrowly spaced or crossing leads. In certain embodiments the precoated bondwire can have a dielectric made from a photosensitive material to allow for selective patterning techniques.

In other embodiments, the dielectric parylene™ can be used. Parylene™ is the trade name for a variety of chemical vapor deposited poly(p-xylylene)polymers used as moisture and dielectric barriers. Parylene™ can be formed in a growth limited condensation reaction using a modified parylene™ deposition system where the die, substrate, and leads are aligned to a photoplate which allows EM radiation (IR, UV, or other) to strike in a precise manner causing selective growth rate of dielectric. Advantageously, this can minimize or eliminate the need for processes to create contact vias, bulk removal of parylene™, etc. Parylene™ and other dielectrics are known to suffer from degradation due to oxygen scission in the presence of oxygen, water vapor and heat. Damage can be limited by metal layers that form excellent oxygen vapor barriers, with thin layers of 3-5 micron thickness capable of forming true hermetic interfaces. Alternatively, if metal has been selectively removed, or not deposited in certain areas due to electrical, thermal, or manufacturing requirements, a wide range of polymer based vapor oxygen barriers can be used, with polyvinyl alcohol (PVA) being one widely used polymer. These polymers can be glob topped, screen printed, stenciled, gantry dispensed, sprayed onto parylene surface that will be exposed to the oxygen or $H_2O$ vapor environment. Advantageously, use of vapor barrier polymers can be a part of a cost reduction strategy, since thicker layers of high cost parylene™ or other oxygen sensitive might otherwise be required.

As will be appreciated, all of the described method steps can benefit from various selective deposition techniques. Selective deposition can be by physical masking, directed polymer deposition, photoresist methods, or any other suitable method for ensuring differential deposition thickness on the metal core, dielectric layer, or other outermost layer at time of deposition. While selective deposition allows for additive methods to build leads, it also allows for subtractive techniques in which dielectric or metal is removed to form multiple impedance interconnects. For example, a package populated by one or more die can be wire-bonded as appropriate for interconnect of all package and device pads. As seen with respect to FIG. 4, which illustrates steps and structures for manufacture of a die package, the dielectric coating 200 can be deposited (step A) to a thickness X-A over a wirebond metal conductor 202, where A is the thickness of the dielectric needed for the secondary interconnect impedance. The secondary impedance wirebond dielectrics can be removed (step B) for example by an etch step, followed by a second coating 204 deposition (step C) followed by metallization 206 of both interconnects (step D). This subtractive process will create wirebonds of two distinct impedances.

In particular, the present invention is directed to a die package comprising a die having a plurality of connection pads, a plurality of leads having a metal cores with a defined core diameter, and a dielectric layer surrounding the metal cores having a defined dielectric thickness, first connection pads held in a mold compound covering the die and the plurality of leads connected to the metal cores, and second connection pads held in a mold compound covering the die and the plurality of leads connected to the metal cores.

The metal core diameters of the plurality of leads may differ in diameter. The impedance of a subset of the plurality the leads may be within 10%.

Further, the invention relates to a method of manufacture the above die package, selected steps of the method being shown in FIG. 2 and elsewhere.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A die package comprising:
- a die having a plurality of connection pads;
- a plurality of leads having a metal core with a defined core diameter, two or more dielectric layers of different composition surrounding the metal core having defined dielectric thicknesses, and an outer metal layer deposited over the dielectric layers, respectively;
- at least one first connection pad held in a mold compound covering the die and the plurality of leads connected to at least one metal core; and
- at least one second connection pad held in the mold compound covering the die and the plurality of leads connected to at least one metal core;
- wherein the first connection pad is connected to the metal core of a first lead with a first metal core diameter, and the second connection pad is connected to the metal core of a second lead with a second metal core diameter, the metal core diameters differing in diameter; and
- wherein the first connection pad is connected to the metal core of a first lead with a first length, and the second connection pad is connected to the metal core of a second lead with a second length, the first length differing from the second length.

2. The die package of claim 1, wherein the first length differs by 50% or more from the second length.

3. The die package of claim 1, wherein the first lead and the second lead have substantially the same impedance or alternatively have distinctly different impedances.

4. The die package of claim 1 including at least one ground pad, wherein at least one of the outer metal layers is connected to the at least one ground pad.

5. The die package of claim 1, wherein the impedance of a subset of the plurality the leads is within 10%.

6. The die package of claim 1, wherein the package is a coreless package without a permanent substrate for die attachment.

7. A method of manufacture of a die package, said die package comprising:
- a die having a plurality of connection pads;
- a plurality of leads having a metal core with a defined core diameter, two or more dielectric layers of different composition surrounding the metal core having defined dielectric thicknesses, and an outer metal layer deposited over the dielectric layers, respectively;
- at least one first connection pad held in a mold compound covering the die and the plurality of leads connected to at least one metal core; and
- at least one second connection pad held in the mold compound covering the die and the plurality of leads connected to at least one metal core;

wherein the first connection pad is connected to the metal core of a first lead with a first metal core diameter, and the second connection pad is connected to the metal core of a second lead with a second metal core diameter, the metal core diameters differing in diameter; said method comprising the following steps:
- placing of one or more dies on a temporary workpiece including temporarily attached pads;
- using wirebonding to connect the die to the temporarily attached pads, a first pad being connected to the metal core of a first wire with a first metal core diameter, and a second pad being connected to the metal core of a second wire with a second metal core diameter, the metal cores differing in diameter;

coating of the metal cores of the wirebonds with two or more dielectric coatings of different composition;

metallization of the dielectric coatings;

overmolding the die assembly; and removing at least part of the temporary workpiece and/or at least part of the overmold to expose the attached pads for connecting to a printed circuit board or another substrate.

8. The method of claim 7, wherein at least part of the temporary workpiece and/or of the overmold is removed by etching, by grinding, and/or by polishing.

9. The method of claim 7, wherein individual dies and their connected leads are singulated and readied for connection to a substrate like a printed circuit board.

* * * * *